US007292121B1

(12) United States Patent
Page

(10) Patent No.: US 7,292,121 B1
(45) Date of Patent: Nov. 6, 2007

(54) RF COMBINING DEVICE AND METHOD

(75) Inventor: Trevor A. Page, Airdrie (CA)

(73) Assignee: Nortel Networks Limited, St. Laurent (CA)

(*) Notice: Subject to any disclaimer, the term of this patent is extended or adjusted under 35 U.S.C. 154(b) by 175 days.

(21) Appl. No.: 11/291,300

(22) Filed: Dec. 1, 2005

(51) Int. Cl.
*H03H 7/46* (2006.01)
*H01P 1/36* (2006.01)

(52) U.S. Cl. ...................... 333/24.2; 333/125; 333/136

(58) Field of Classification Search ................. 333/1.1, 333/24.2, 127, 125, 128, 136
See application file for complete search history.

(56) References Cited

U.S. PATENT DOCUMENTS 6,741,144 B2 * 5/2004 Maeda et al. ............... 333/127

* cited by examiner

*Primary Examiner*—Stephen E. Jones
(74) *Attorney, Agent, or Firm*—Schwegman, Lundberg & Woessner, P.A.

(57) ABSTRACT

Two or more reflective isolator elements are joined at their outputs to produce an RF combining structure. An RF circulator element is used for each input RF signal as a reflective isolator element to provide a different phase delay according to the direction of propagation of the RF wave. The output of the reflective isolator elements thus exhibits a high output impedance, when looking into the RF output port, preventing back propagation of signals from one input port to another.

20 Claims, 3 Drawing Sheets

RF COMBINING DEVICE AND METHOD

BACKGROUND

Efficient combining of RF signals of the same or similar frequencies with varying relative phases and amplitudes cannot be achieved with such devices as Wilkinson or hybrid combiners, as they rely upon specific relative power levels and phases of the input signals to operate effectively and provide isolation between their inputs.

In the case of standard quadrature hybrid combiners (such as branch line couplers), the phase of the input signals must differ by 90 degrees with equal amplitudes for optimum combining efficiency. These criteria are required to ensure optimal voltage cancellation at specific nodes within the combining network, thus providing isolation and efficient operation.

An ultra high efficiency RF power amplifier could be realized by employing different biasing, device sizing and RF drive levels to the individual high power gain stages. However, the aforementioned combining schemes cannot provide efficient combining and isolation between the stages of such a power amplifier. Therefore, efficiency would be degraded, and portions of the RF energy from a single stage will be delivered to the other stages, effectively causing load impedance shifts, complicating the amplifier's behavior.

In the case of Wilkinson combiners, specific relative amplitudes and phases (usually zero) are required to minimize loss within the isolation resistor. Using such prior combining schemes, failure of a high power gain stage will result in a dramatic drop in efficiency. In the case where two stages are combined by a quadrature hybrid or Wilkinson combiner, at least half of the power of the stage remaining in operation will be lost, due to loss within the combining network.

SUMMARY

Two or more reflective isolator elements are joined at their outputs to produce an RF combining structure. An RF circulator element is used within each reflective isolator element to provide a different phase delay according to the direction of propagation of the RF wave. The output of the reflective isolator elements exhibits a high impedance to signals propagating backwards into it, thus preventing propagation of signals from one input to another.

DETAILED DESCRIPTION

In the following description, reference is made to the accompanying drawings that form a part hereof, and in which is shown by way of illustration specific embodiments which may be practiced. These embodiments are described in sufficient detail to enable those skilled in the art to practice the invention, and it is to be understood that other embodiments may be utilized and that structural, logical and electrical changes may be made without departing from the scope of the present invention. The following description is, therefore, not to be taken in a limited sense, and the scope of the present invention is defined by the appended claims.

Figure 1:
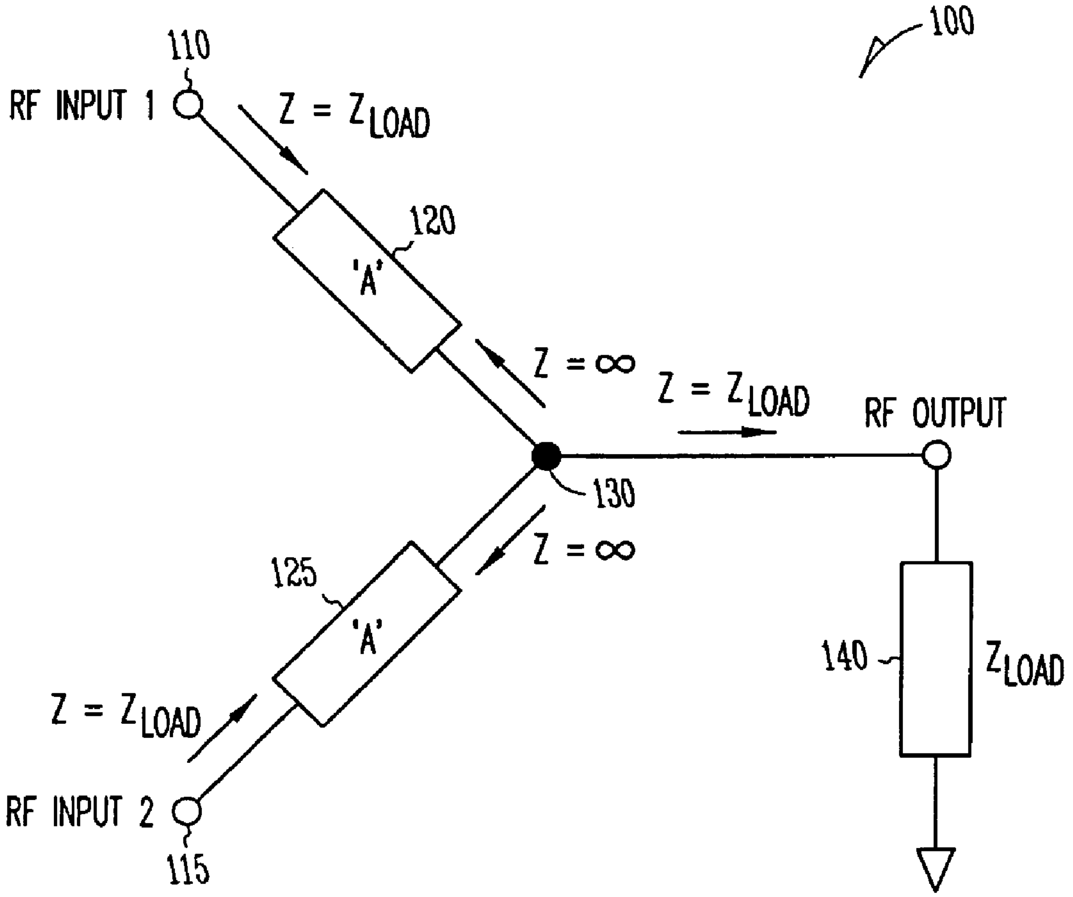
FIG. 1 is a block diagram of a three port RF combiner according to an example embodiment.

FIG. 1 is a block diagram of a three port RF combiner 100 according to an example embodiment. Two input ports, 110 and 115 are shown coupled through two reflective isolator elements 120 and 125 respectively. The input ports are coupled to RF signals, which are combined through the reflective isolator elements to a node 130. Node 130 is an RF output port, which may be coupled to load 140, such as an antenna for broadcast of the combined RF signals. The input ports each have an input impedance defined as $Z_{load}$ and an output port impedance defined as Z, looking into the output port, which in one embodiment is very large, and may essentially be referred to as infinite. The antenna, or output load 140 is also characterized as having an impedance of $Z_{load}$, matching the input impedances of the reflective isolator elements 120 and 125 in one embodiment. The reflective isolator elements 120 and 125 in one embodiment provide isolation so that sources are not presented with different impedances due to leakage currents. Further, in one embodiment, inputs need not be correlated to be combined efficiently. The isolators also enable use of redundancy for continued operation should components fail, with significantly lower loss than achievable using prior art combining schemes.

Figure 2:
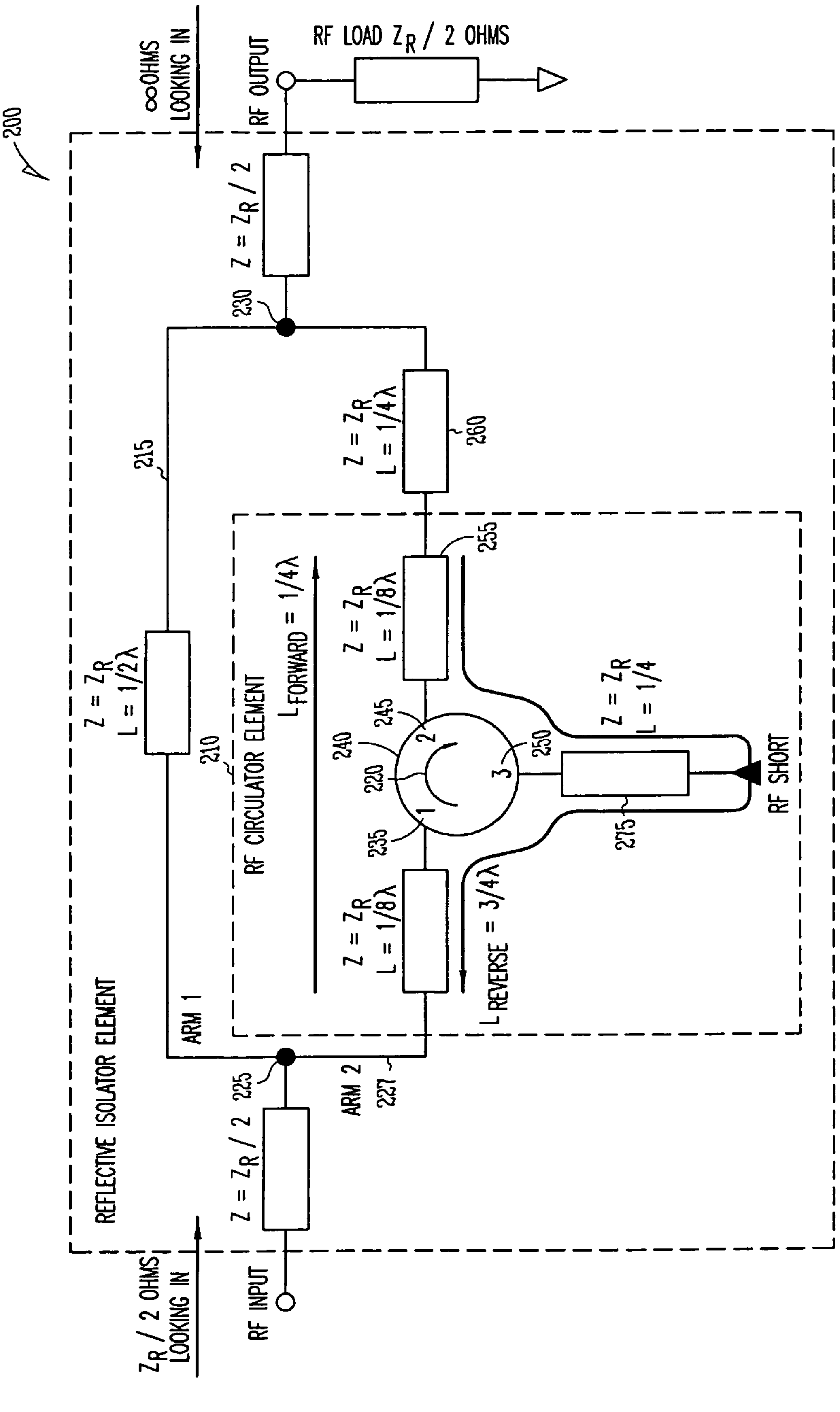
FIG. 2 is a block diagram of a reflective isolator element used for the RF combiner of FIG. 1 according to an example embodiment.

FIG. 2 is a block diagram of a reflective isolator element 200 used for elements 120 and 125 of the RF combiner 100 of FIG. 1 according to an example embodiment. Reflective isolator element 200 consists of an RF circulator element 210 in parallel with a transmission line (or waveguide) 215 with a phase delay equal to that of a forward path 220 of the RF circulator element 210. Many different types of circulator elements may be used, such as those available from SCD Components, Inc. or many other manufacturers. An RF wave entering the reflective isolator element at an RF input 225 is split equally between the RF circulator element 210 and the parallel transmission line 215 because both have a length of ½λ and impedance matched elements. The RF wave in the forward going direction will recombine at an RF output 230 without loss, as phases of the aforementioned paths are equal in one embodiment. Therefore, the impedance of the reflective isolator element, looking into its input port will assume that of the RF load presented to its RF output.

The parallel transmission line 215 may be thought of as arm one of the reflective isolator element, with arm two having two paths that contain the RF circulator element 210. The RF circulator element 210 is coupled to input node 225 by a line 227 having an impedance of $Z_R$ and length of ⅛λ The lines may be transmission lines or waveguides, or other types of lines that are capable of carrying RF signals. Line 227 is coupled to port 1 at 235 of circulator 240. The circulator 240 has three ports in one embodiment, and restricts RF signals to travel in one direction from port 1 at 235 to port 2 at 245, and from port 2 to port 3 at 250, and from port 3 to port 1. An output portion 255 of the RF circulator element 210 has an impedance of $Z_R$ and length of ⅛λ, and is then coupled to a line 260, having an impedance of $Z_R$ and length of ¼λ As can be seen, the phase shift in both arms is the same in the forward going direction. The rectangles in the figures are merely symbols used to represent length and impedance of the lines.

An RF wave entering the reflective isolator element from the output node 230 will split equally between the RF circulator element 210 and the parallel transmission line 215. However, the signals will be out of phase at node 225, and hence no RF current will be delivered to the RF input. Therefore, the impedance of the reflective isolator element 200, looking into its output port will be infinite.

This zeroing of backward traveling waves is accomplished via the path back through the RF circulator element 210 reaching port 2 at 245, and being directed toward port 3 at 250. Port 3 is coupled to an RF short 270 via a path 275 having an impedance of $Z_R$ and a length of ¼λ. The backward traveling wave is reflected at the RF short circuit 270 and travels back to the RF circulator element to port 1 at 235, and from there to input node 225. The total shift in phase of this reverse path is λ, while that of the reverse path in the parallel arm is ½λ. In one embodiment, the path length difference is an odd multiple of ½λ to obtain cancellation.

Figure 3:
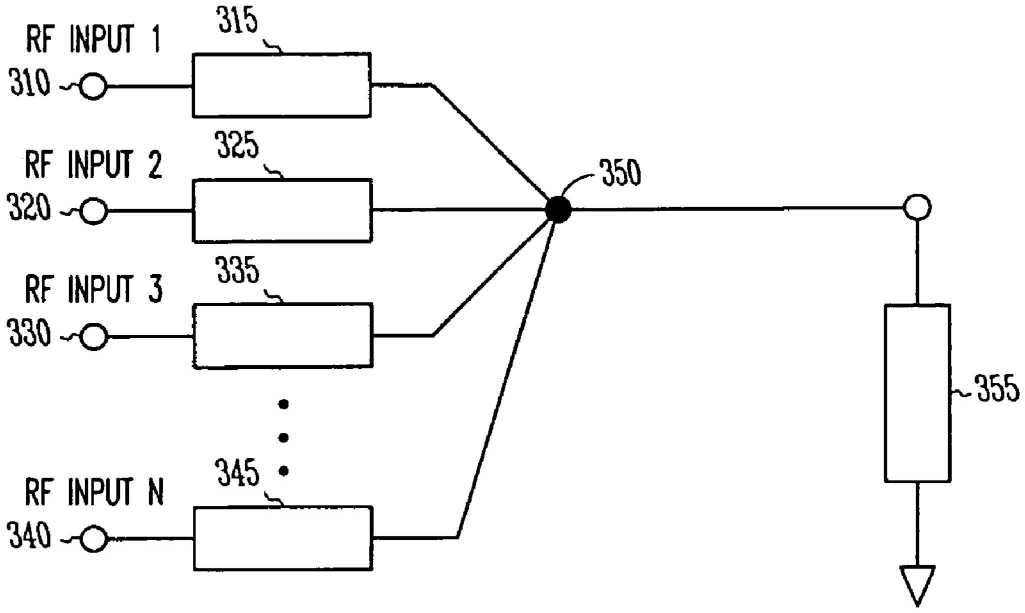
FIG. 3 is a block diagram illustrating multiple input signals being combined according to an example embodiment.

FIG. 3 is an alternative embodiment illustrating multiple RF input nodes 310, 320, 330, and 340 being combined. Each input node in one embodiment is coupled to a reflective isolator element 315, 325, 335 and 345 respectively, which in turn are coupled to an output node 350. Since the output impedance of each of the reflective isolator elements is essentially infinite, there is no feedback from other outputs. The output node 350 may be coupled to a load, such as an antenna 355 for transmitting the combined RF input signals.

In one embodiment, the bandwidth of the circulator may be chosen to match the application—they are inherently narrow band (frequency) devices. Hence, the combining network will be frequency specific. The insertion phase of the circulator should be considered when designing the combiner (it may dictate the distance from port 3 to the RF short or open circuit, and the phase delays of the other transmission line elements). The insertion loss of the circulator may impact combining efficiency. Optimum combining efficiency may occur when the input signals are of the same frequency.

The Abstract is provided to comply with 37 C.F.R. §1.72(b) to allow the reader to quickly ascertain the nature and gist of the technical disclosure. The Abstract is submitted with the understanding that it will not be used to interpret or limit the scope or meaning of the claims.

What is claimed is:

1. A combiner element comprising:
- an input;
- a first arm having a length, the first arm coupled to an output;
- a second arm coupled to the output having a first path with a first length for signals traveling from the input to the output and a second path with a second length for signals traveling toward the input from the output, wherein the second length is an odd multiple of ½ wavelength different from the first length.

2. The combiner element of claim 1 wherein the first arm and the second arm are impedance matched.

3. The combiner element of claim 1 wherein the lengths are selected as a function of a selected RF frequency.

4. The combiner element of claim 1 wherein the second arm comprises a circulator that passes signals on the first path between the input and output, and directs signals propagating toward the input to a short.

5. The combiner element of claim 4 wherein the circulator directs signals from the short along the second path toward the input.

6. The combiner element of claim 1 wherein the first arm has a length of ½λ and wherein the first path of the second arm has a length of ½λ.

7. The combiner element of claim 6 wherein the second path of the second arm has a length of ¾λ.

8. A RF combiner comprising:
- multiple inputs and an output; and
- a reflective element coupled between each input and the output, each reflective element comprising:
  - a first arm having a length, the first arm coupled to the output;
  - a second arm coupled to the output having a first path with a first length for signals traveling from the input to the output and a second path with a second length for signals traveling toward the input from the output, wherein the second length is an odd multiple of ½ wavelength different from the first length.

9. The RF combiner of claim 8 wherein each reflective element comprises a circulator in the second arm.

10. The combiner element of claim 8 wherein the first arm and the second arm are impedance matched.

11. The combiner element of claim 8 wherein the lengths are selected as a function of a selected RF frequency.

12. The combiner element of claim 8 wherein the second arm comprises a circulator that passes signals on the first path between the input and output, and directs signals propagating toward the input to a short.

13. The combiner element of claim 12 wherein the circulator directs signals from the RF short circuit along the second path toward the input.

14. The combiner element of claim 8 wherein the first arm has a length of ½λ and wherein the first path of the second arm has a length of ½λ.

15. The combiner element of claim 14 wherein the second path of the second arm has a length of ¾λ.

16. A method comprising:
- dividing an RF signal into a first arm and a second arm;
- providing two different paths for RF signals in the second arm, wherein a first forward path has a length equal to the length of the first arm, and wherein a second backward path has a length ½λ different from the length of the first arm.

17. The method of claim 16 and further comprising coming multiple input RF signals in the same manner.

18. The method of claim 16 wherein a circulator is used to direct the RF signals on respective forward and backward paths in the second arm.

19. The method of claim 18 wherein the circulator directs backward RF signals to a RF short.

20. The method of claim 19 wherein the RF short is coupled to the circulator by a line of length ¼λ.

* * * * *